United States Patent
Wu et al.

(10) Patent No.: US 6,870,782 B2
(45) Date of Patent: Mar. 22, 2005

(54) ROW REDUNDANCY MEMORY REPAIR SCHEME WITH SHIFT TO ELIMINATE TIMING PENALTY

(75) Inventors: Sifang Wu, Savage, MN (US); Ghasi R. Agrawal, Sunnyvale, CA (US); Kevin R. LeClair, Prior Lake, MN (US)

(73) Assignee: LSI Logic Corporation, Milpitas, CA (US)

( * ) Notice: Subject to any disclaimer, the term of this patent is extended or adjusted under 35 U.S.C. 154(b) by 50 days.

(21) Appl. No.: 10/414,516

(22) Filed: Apr. 15, 2003

(65) Prior Publication Data

US 2004/0208065 A1 Oct. 21, 2004

(51) Int. Cl.[7] .............................................. G11C 29/00
(52) U.S. Cl. ................. 365/201; 365/200; 365/189.02; 365/225.7
(58) Field of Search ............................... 365/200, 201, 365/189.02, 225.7

(56) References Cited

U.S. PATENT DOCUMENTS

| | | | | | |
|---|---|---|---|---|---|
| 5,255,227 A | * | 10/1993 | Haeffele | ..................... | 365/200 |
| 5,764,577 A | * | 6/1998 | Johnston et al. | ............ | 365/200 |
| 6,141,269 A | * | 10/2000 | Shiomi et al. | .............. | 365/200 |
| 6,567,323 B2 | * | 5/2003 | Pitts et al. | .................. | 365/200 |
| 2004/0105289 A1 | * | 6/2004 | Roth et al. | ..................... | 365/49 |

* cited by examiner

*Primary Examiner*—Hoai Ho
(74) *Attorney, Agent, or Firm*—Yee & Associates, P.C.

(57) ABSTRACT

A memory having built-in self repair with row shifting is provided. The rows in the memory are divided into smaller row groups and a bad row group is repaired with a redundant row group. Each row group receives a row select signal, which is fed into a shift circuit for the row group and a shift circuit for an adjacent row group. A shift circuit is provided for the redundant row group and the shift circuit for the redundant row group receives the row select signal for only the adjacent row group. If a bad row group is detected, then starting with the row group furthest from the redundant row group, the shift circuit for each row group before the bad row group is deactivated. The row group select signal and word line signal for the bad row group are disabled. The shift circuit for the bad row group and the shift circuit for each row group after the bad row group are activated. Therefore, the bad row group is disabled and the redundant row group fills the void.

13 Claims, 8 Drawing Sheets

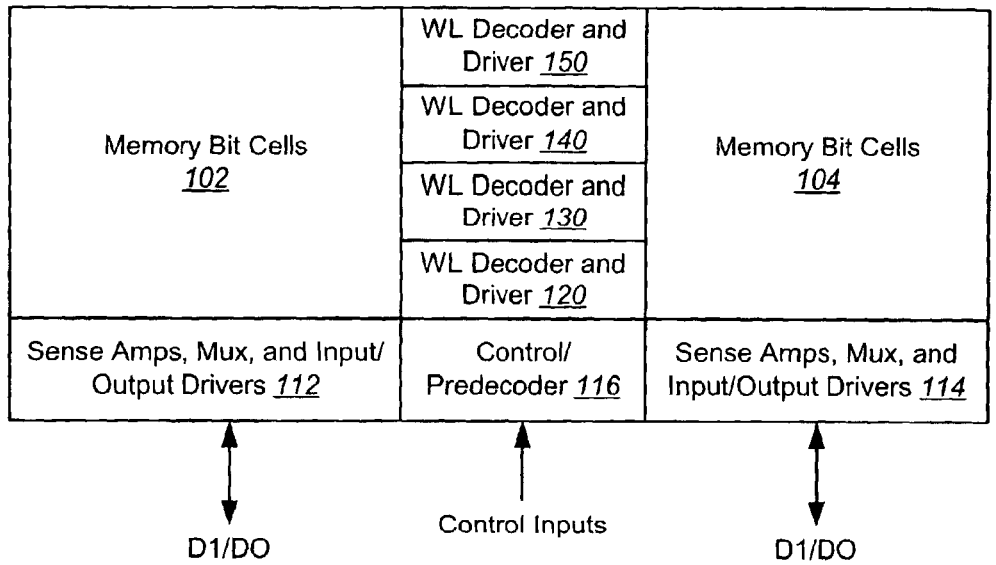
FIG._1
(PRIOR ART)
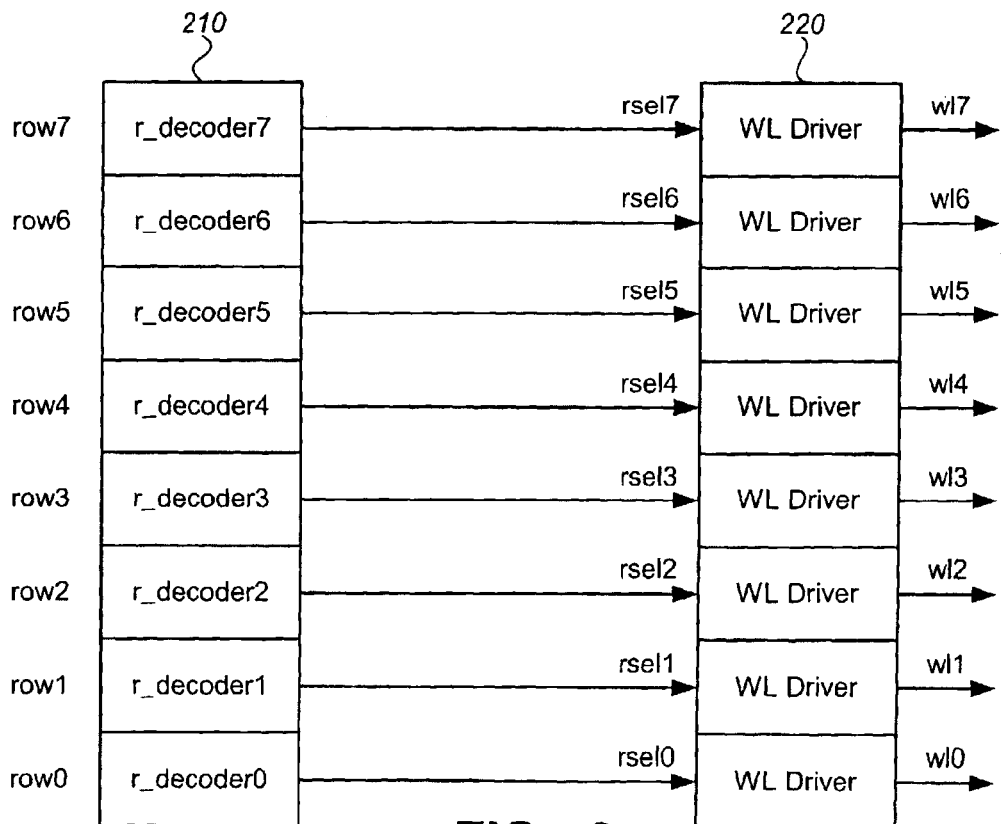
FIG._2
(PRIOR ART)

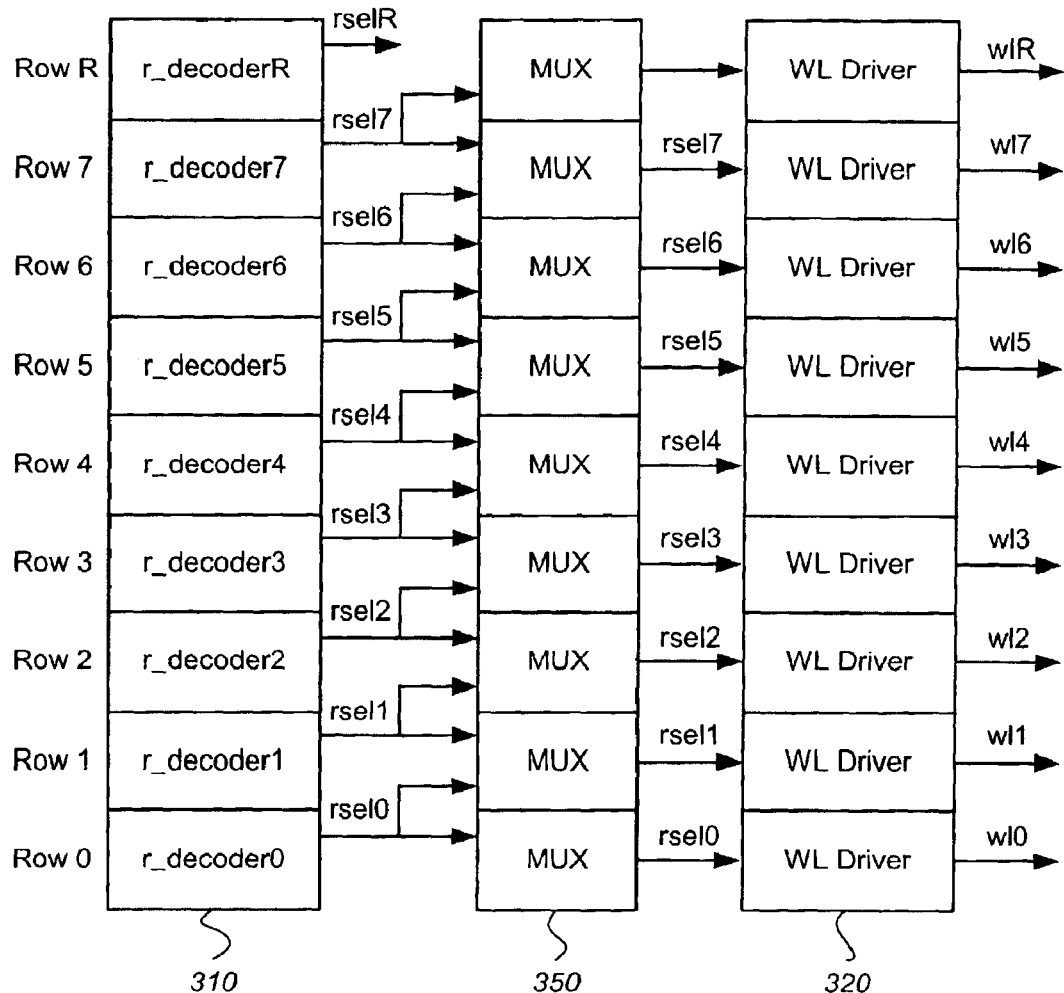
FIG._3

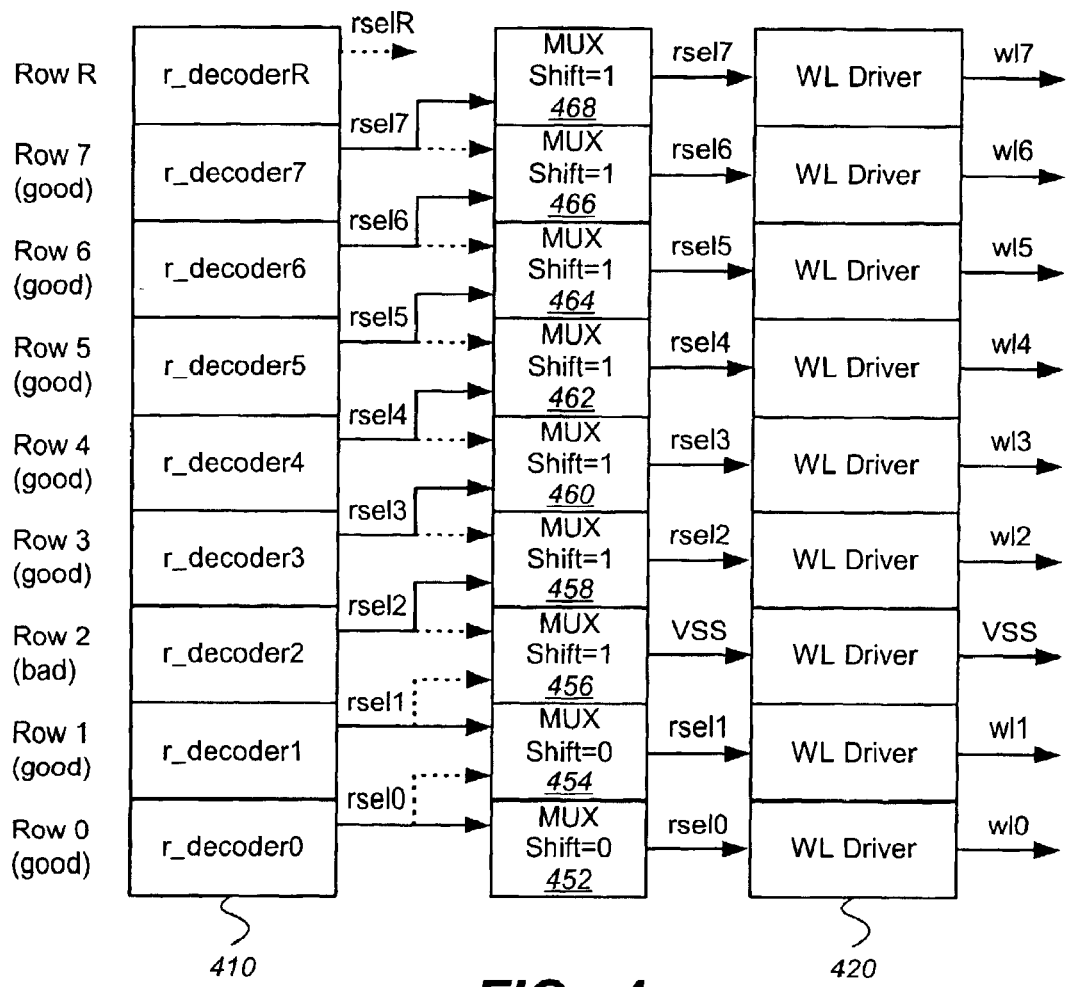
FIG._4

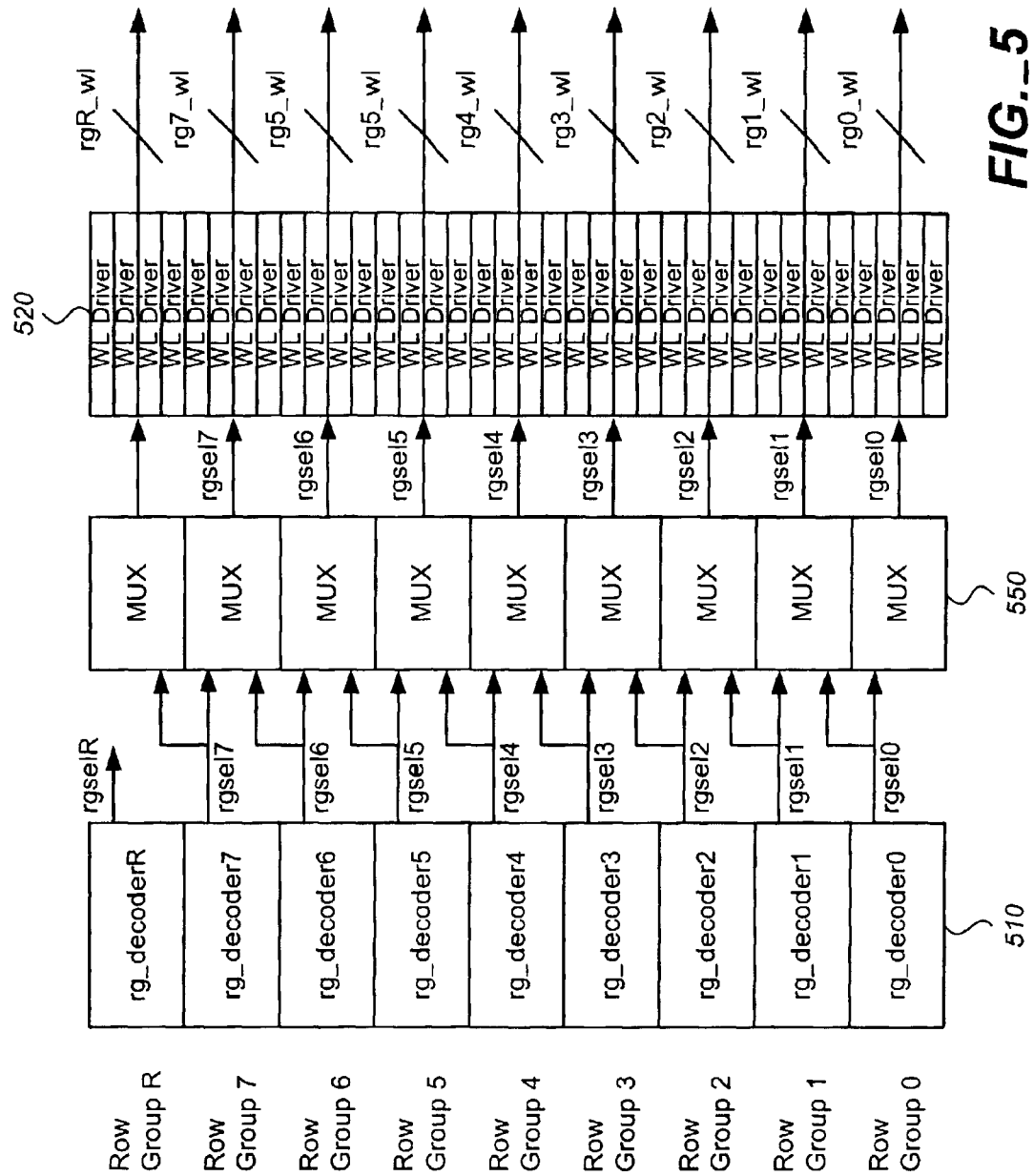
FIG._5

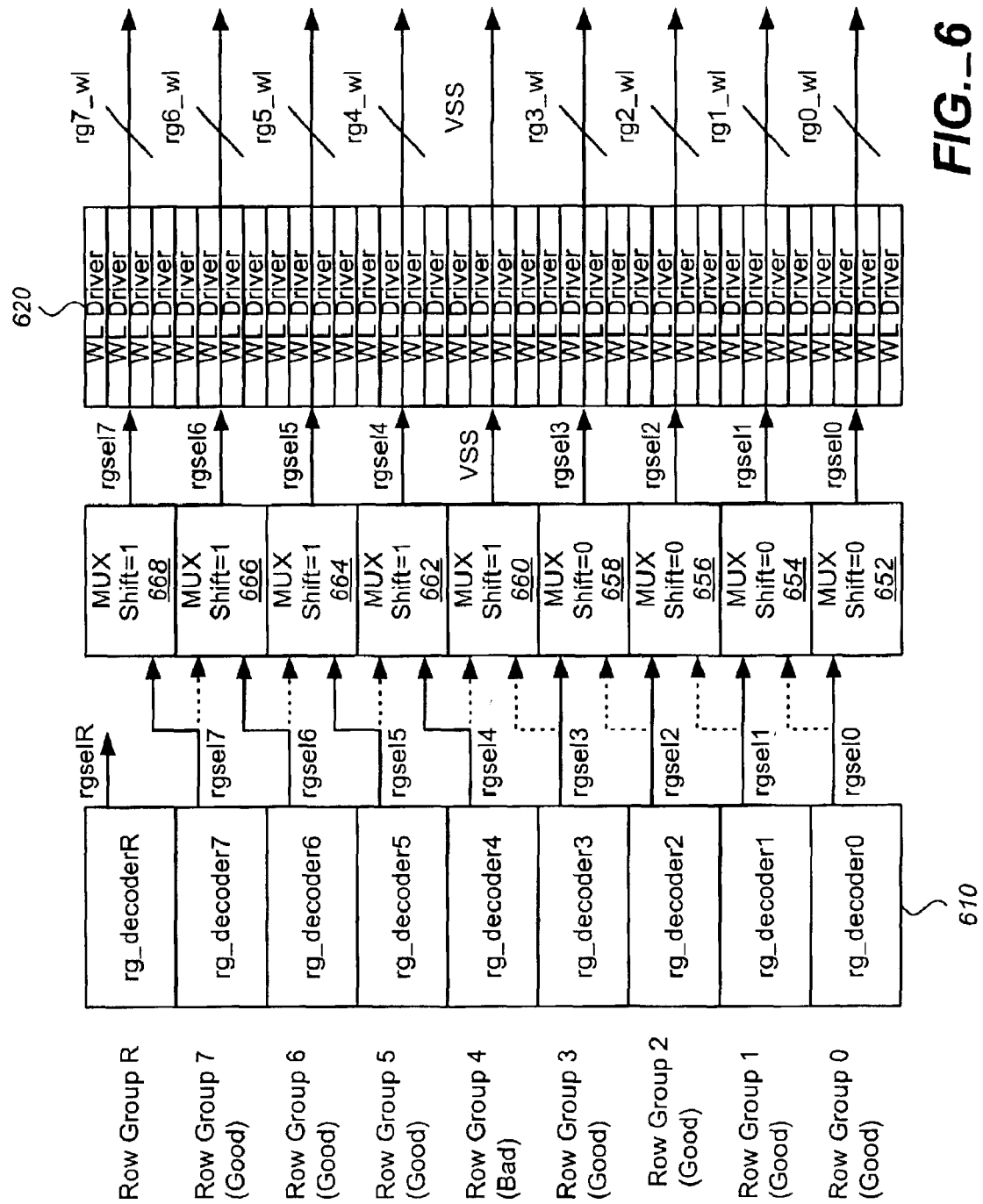
FIG._6

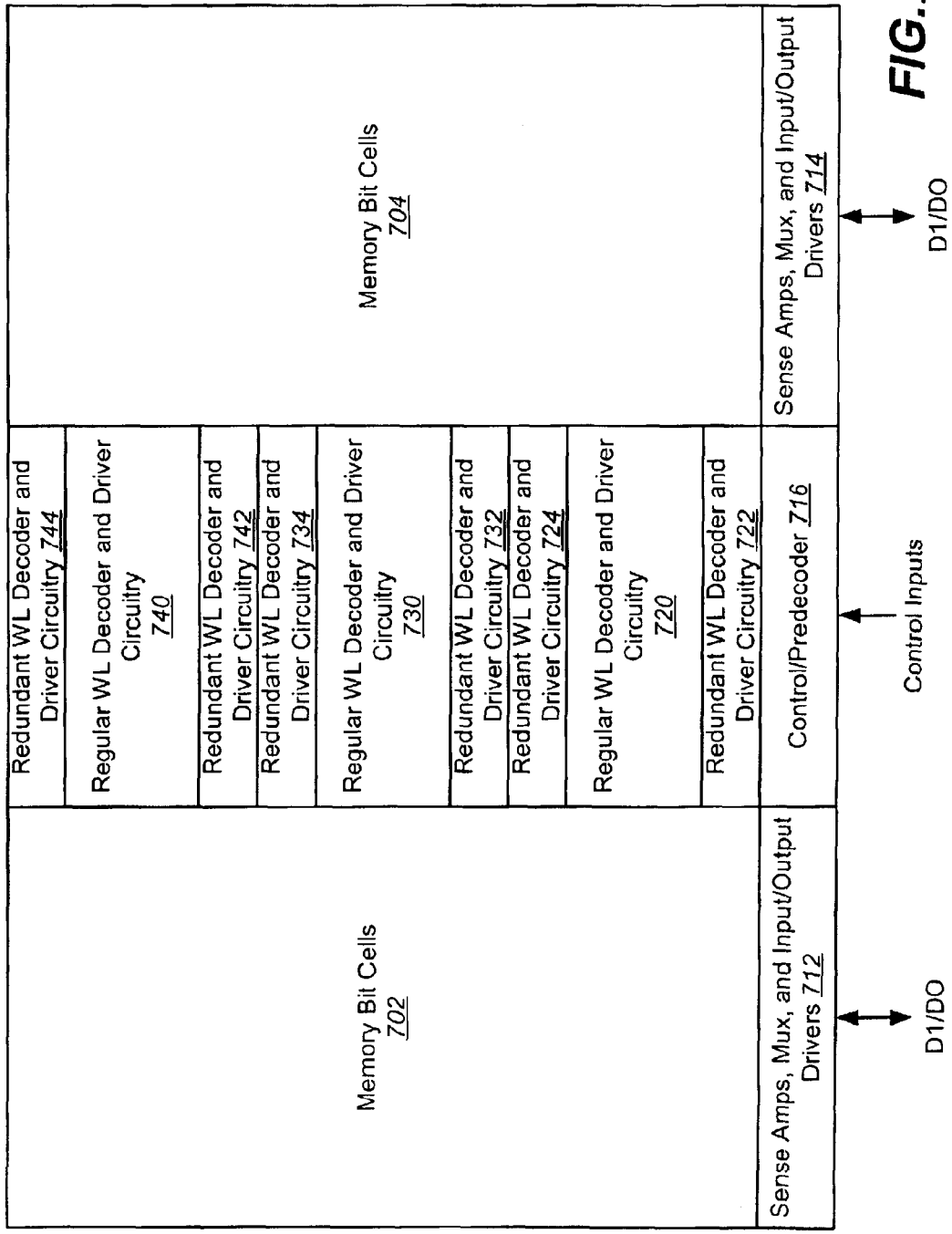
FIG._7

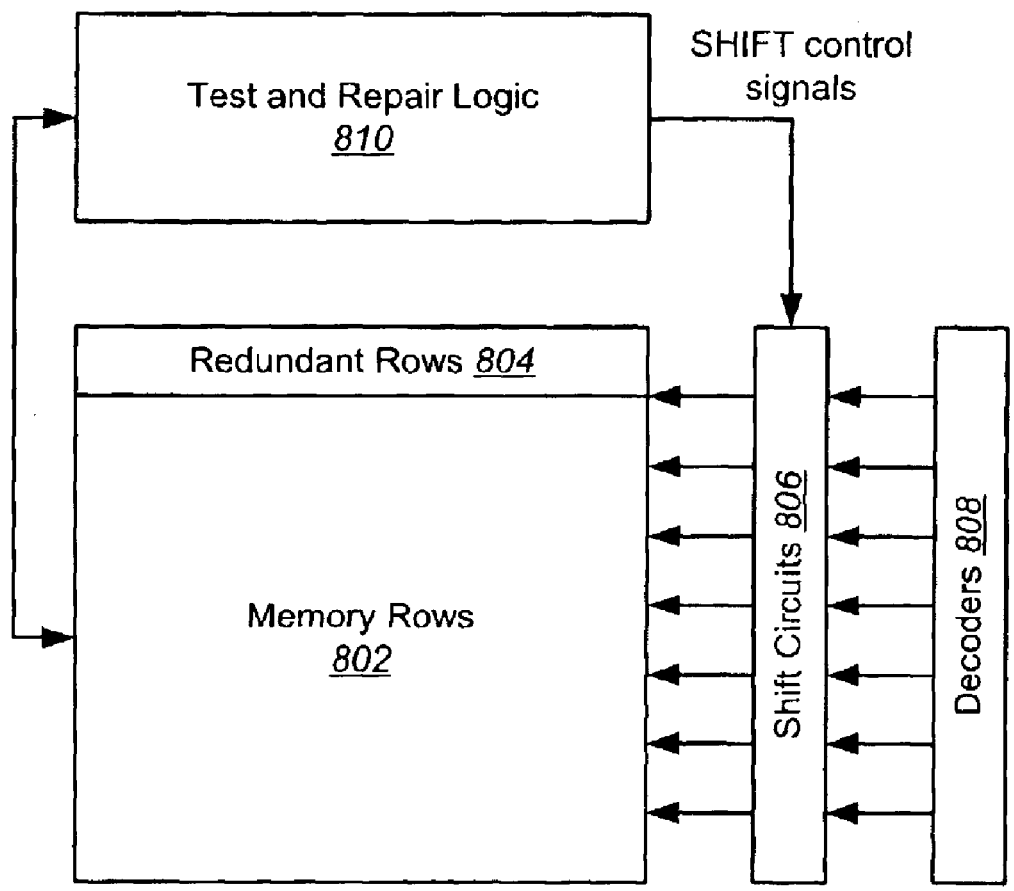
FIG._8

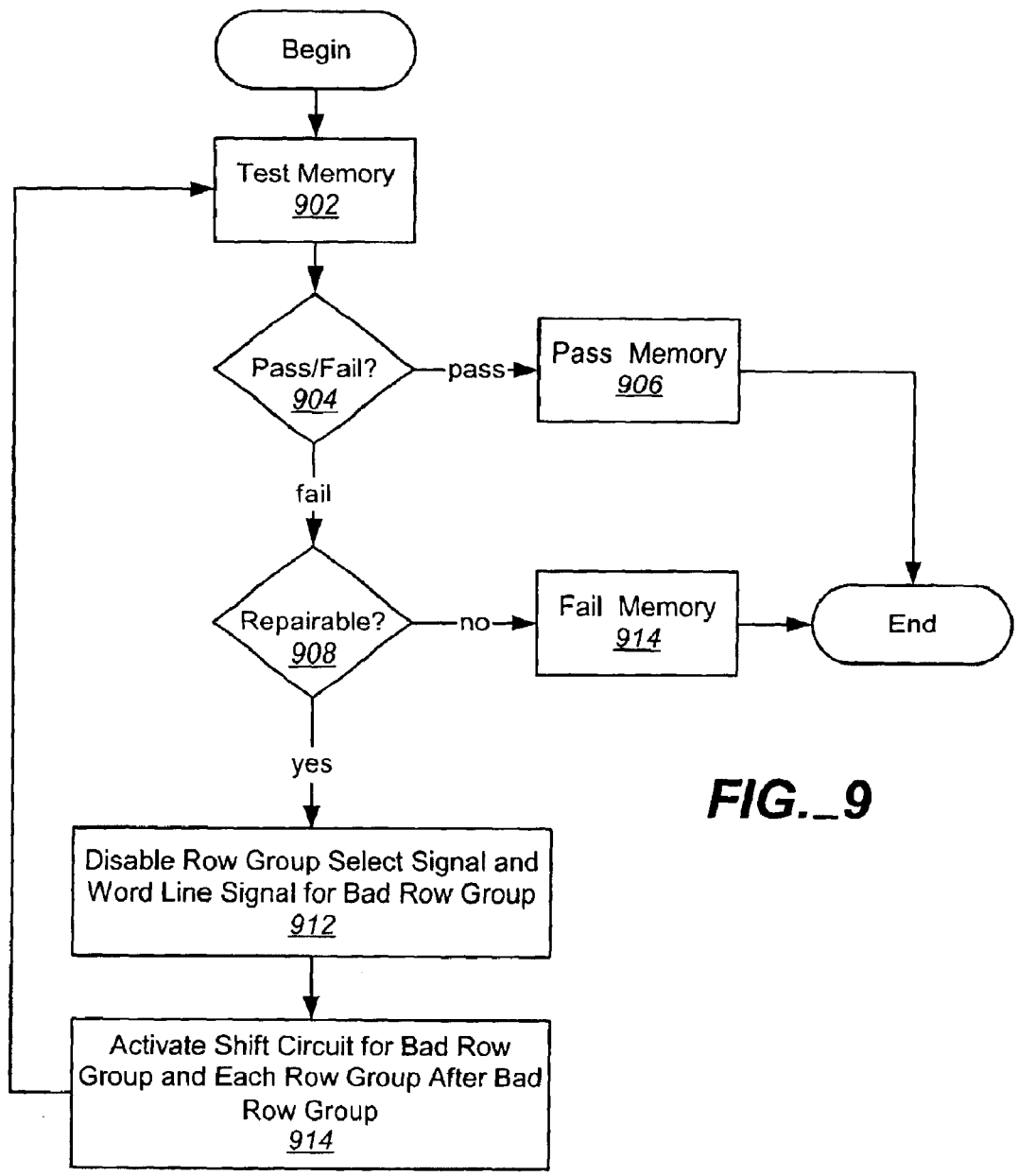
FIG._9

ROW REDUNDANCY MEMORY REPAIR SCHEME WITH SHIFT TO ELIMINATE TIMING PENALTY

BACKGROUND OF THE INVENTION

1. Technical Field

The present invention relates to memory design and, in particular, to built-in self repair. Still more particularly, the present invention provides a method and apparatus for providing built-in self repair with row shifting.

2. Description of the Related Art

A memory circuit is like an electronic checkerboard, with each square holding one bit of data or instruction. Each square, also referred to as a "cell," has a separate address and can be manipulated independently. Cells are addressed as rows of cells. When manufacturing a memory circuit, or chip, rows must be addressed with row select signals and word line signals. FIG. 1 is a diagram illustrating an example of a basic memory structure. The memory structure includes memory bit cells 102, 104. Control/predecoder 116 receives control inputs and asserts word lines through word line decoders and drivers 120, 130, 140, and 150. Inputs and Outputs are provided through sense amplifiers, multiplexors, and input/output drivers 112, 114.

FIG. 2 illustrates the details of a word line decoder and driver area for the access of word lines for standard memory. Control inputs for rows 0–7 are provided to row decoders 210. The row decoders generate row select signals rsel0 to rsel7. Word line drivers 220 receive the row select signals and generate word line signals wl0 to wl7. The example depicted in FIG. 2 shows eight rows; however, more or fewer rows may be included. More particularly, the memory structure will likely include thousands of rows of memory cells.

Due to difficulties in manufacturing a memory with a high number of elements, bad rows or groups of rows are likely to occur. After fabrication, a memory chip may be tested to determine whether bad cells exists. However, discarding a memory chip for one bad memory cell or row of cells is costly. Therefore, memory circuits are designed with built-in self repair (BISR) to improve manufacturing yield. There are many types of BISR schemes available, such as row redundancy, column redundancy, block redundancy, and I/O redundancy.

Almost all current row redundancy BISR schemes use address remapping, which compares the incoming memory row address to stored defective row addresses to tell if the incoming memory row address is a defective row address. If the incoming row address is a defective row address, then the access to the defective row is disabled and it is remapped to an address of a redundant row. A defective row can be disabled during every access cycle (on the fly) or only during the start of all memory access.

These schemes require extra address access time, because of the row address remap. Also, to disable the defective row on the fly requires that the address is set well in advance to do the comparison and disable the defective row. This adds large extra penalty into the address setup time and is generally not acceptable in most designs. Furthermore, address remap circuitry adds to the complexity and layout area of the memory architecture.

Therefore, it would be advantageous to provide an improved method and apparatus for built-in self repair of rows in a memory circuit.

SUMMARY OF THE INVENTION

The present invention provides a built-in self repair with row shifting for memory circuits. The rows in the memory are divided into smaller row groups and a bad row group is repaired with a redundant row group. Each row group receives a row select signal, which is fed into a shift circuit for the row group and a shift circuit for an adjacent row group. A shift circuit is provided for the redundant row group and the shift circuit for the redundant row group receives the row select signal for only the adjacent row group. If a bad row group is detected, then starting with the row group furthest from the redundant row group, the shift circuit for each row group before the bad row group is deactivated. The row group select signal and word line signal for the bad row group are disabled. The shift circuit for the bad row group and the shift circuit for each row group after the bad row group are activated. Therefore, the bad row group is disabled and the redundant row group fills the void.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a diagram illustrating an example of a basic memory structure;

FIG. 2 illustrates the details of a word line decoder and driver area for the access of word lines for standard memory;

FIG. 3 is an example diagram illustrating a row repair scheme with row shifting in accordance with a preferred embodiment of the present invention;

FIG. 4 is a diagram illustrating an example row repair by shifting out a bad row in accordance with a preferred embodiment of the present invention;

FIG. 5 is an example diagram illustrating a row group repair scheme with row group shifting in accordance with a preferred embodiment of the present invention;

FIG. 6 is a diagram illustrating an example row group repair by shifting out a bad row group in accordance with a preferred embodiment of the present invention;

FIG. 7 is an example memory structure broken up into a plurality of blocks in accordance with a preferred embodiment of the present invention;

FIG. 8 is a block diagram illustrating a memory with shifting row repair in accordance with a preferred embodiment of the present invention; and FIG. 9 is a flowchart of the operation of a row shifting repair scheme in accordance with a preferred operation of the present invention.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

With reference now to the figures and in particular with reference to FIG. 3, an example diagram illustrating a row repair scheme with row shifting is shown in accordance with a preferred embodiment of the present invention. The memory circuit includes a plurality of rows. For simplicity, only eight rows are shown. However, the memory may include more or fewer rows depending upon the implementation.

Control inputs for rows 0–7 are provided to row decoders 310. The row decoders generate row select signals rsel0 to rsel7. In accordance with a preferred embodiment of the present invention, the memory includes shifting stage 350 including a shift circuit (multiplexor) for each row. The row select signal rselR is not used. Row decoder r_decoderR is shown for design symmetry; however, the redundant row decoder may optionally be eliminated. Multiplexors 350 receive row select signals and are activated or deactivated based on a shift signal. Shift signals are received from control/predecoder circuitry.

When the memory is tested and a bad row is identified, the shift signals for the bad row and each row from the bad row to the redundant row are asserted. The row select signal for the bad row is disabled. When a shift signal is asserted, the corresponding multiplexor is activated and the row select signal from the previous row is outputted. Word line drivers 320 receive the shifted row select signals from multiplexors 350 and generate word line signals wl0 to wl7. The signal wlR is disabled (VSS) if no bad row is identified; however, wlR takes the value of wl7 if a bad row is identified and the word line signals are shifted. The example depicted in FIG. 3 shows eight rows; however, more or fewer rows may be included. More particularly, the memory structure will likely include thousands of rows of memory cells.

The row repair scheme with row shifting of the present invention has a small area penalty, since only a small redundant row area is provided without complicated address remapping circuitry. The row shifting repair scheme has a minor time penalty due to shifting stage 350; however, the design is simplified and the time penalty is significantly reduced while still providing an effective repair scheme for a bad row.

Turning now to FIG. 4, a diagram is shown illustrating an example row repair by shifting out a bad row in accordance with a preferred embodiment of the present invention. Control inputs for rows 0–7 are provided to row decoders 410. The row decoders generate row select signals rsel0 to rsel7. In accordance with a preferred embodiment of the present invention, the memory includes a shifting stage including a shift circuit (multiplexor) 452–468 for each row. Multiplexors 350 receive row select signals and are activated or deactivated based on a shift signal.

When the memory is tested, row 2 is identified as a bad row. The shift signals for row 2 to row R are asserted. Multiplexors 452 and 454 output rsel0 and rsel1, respectively. The row select signal for row 2 is disabled. The shift signal for multiplexor 456 is asserted and the multiplexor outputs a value of VSS (disabled). The shift signal for multiplexors 458–468 are asserted and the row select signal from the previous row is outputted from each multiplexor. Word line drivers 420 receive the shifted row select signals from multiplexors 452–468 and generate word line signals wl0 to wl7. The word line corresponding to the bad row is given a value of VSS (disabled).

With reference now to FIG. 5, an example diagram illustrating a row group repair scheme with row group shifting is shown in accordance with a preferred embodiment of the present invention. The memory circuit includes a plurality of row groups. For simplicity, only eight row groups are shown. However, the memory may include more or fewer row groups and may divide the rows into more or fewer groups depending upon the implementation.

Control inputs for row groups 0–7 are provided to row group decoders 510. The row group decoders generate row group select signals rgsel0 to rgsel7. In accordance with a preferred embodiment of the present invention, the memory includes shifting stage 550 including a shift circuit (multiplexor) for each row. The row group select signal rgselR is not used. Row group decoder rg_decoderR is shown for design symmetry; however, the redundant row group decoder may optionally be eliminated. Multiplexors 550 receive row group select signals and are activated or deactivated based on a shift signal. Shift signals are received from control/predecoder circuitry.

When the memory is tested and a bad row group is identified, the shift signals for the bad row group and each row group from the bad row group to the redundant row group are asserted. The row group select signal for the bad row group is disabled. When a shift signal is asserted, the corresponding multiplexor is activated and the row group select signal from the previous row group is outputted. Word line drivers 520 receive the shifted row group select signals from multiplexors 550 and generate row group word line signals rg0_wl to rg7_wl. The signal rgR_wl is disabled (VSS) if no bad row group is identified; however, rgR_wl takes the value of rg7_wl if a bad row group is identified and the word line signals are shifted. The example depicted in FIG. 5 shows eight row groups; however, more or fewer row groups may be included.

Turning now to FIG. 6, a diagram is shown illustrating an example row group repair by shifting out a bad row group in accordance with a preferred embodiment of the present invention.

Control inputs for row groups 0–7 are provided to row group decoders 610. The row group decoders generate row group select signals rgsel0 to rgsel7. In accordance with a preferred embodiment of the present invention, the memory includes a shifting stage including a shift circuit (multiplexor) 652–668 for each row group. Multiplexors 650 receive row group select signals and are activated or deactivated based on a shift signal.

When the memory is tested, row group 4 is identified as a bad row group. The shift signals for row group 4 to row group R are asserted. Multiplexors 652–658 output rsel0 to rsel3. The row group select signal for row group 4 is disabled. The shift signal for multiplexor 660 is asserted and the multiplexor outputs a value of VSS (disabled). The shift signal for multiplexors 662–668 are asserted and the row group select signal from the previous row group is outputted from each multiplexor. Word line drivers 620 receive the shifted row group select signals from multiplexors 652–668 and generate row group word line signals rg0_wl to rg7_wl. The row group word line corresponding to the bad row group is given a value of VSS (disabled).

The row repair scheme with row shifting of the present invention may also be extended to include more than one redundant row or row group in one memory structure. With reference to FIG. 7, an example memory structure broken up into a plurality of blocks is shown in accordance with a preferred embodiment of the present invention. The memory structure includes memory bit cells 702, 704. Control/predecoder 716 receives control inputs and asserts word lines through word line decoder and driver circuitry. Each block is shown to have two redundant rows or row groups to support the replacement of two separate defects.

The shifting within one block may be self-contained. In other words, any defect within regular word line decoder and driver circuitry 720 may replace rows using redundant word line decoder and driver circuitry 722 and 724. Any defect within regular word line decoder and driver circuitry 730 may replace rows using redundant word line decoder and driver circuitry 732 and 734. Similarly, any defect within regular word line decoder and driver circuitry 740 may replace rows using redundant word line decoder and driver circuitry 742 and 744. A redundant element outside a block cannot be used to repair a defect found inside the block. Control inputs for all rows or row groups corresponding to regular word line decoder and driver circuitry are received through control/predecoder 716. Data inputs and outputs are provided through sense amplifiers, multiplexors, and input/output drivers 712, 714.

Moreover, to support two redundant elements within a block, the multiplexors must support shifting upwards and downwards. In the example shown in FIG. 7, the multiplexors must be 3:1 multiplexors. A first defect found within a block may be replaced by shifting the access of that row downward and a second defect found may be replaced by shifting the access of that row upward. Modifications may be made to the example shown in FIG. 7 within the scope of the present invention. For example, with a 3:1 multiplexor, two defects may be replaced by shifting upward. Similarly, two defects may be replaced by shifting downward. Furthermore, a 4:1 or 8:1 multiplexor may be used to disable even more defective rows.

With reference to FIG. 8, a block diagram illustrating a memory with shifting row repair is depicted in accordance with a preferred embodiment of the present invention. The memory includes memory rows 802 and redundant rows 804. Shift circuits 806 are selectively activated to shift out bad rows from memory rows 802 and redundant rows 804 are shifted in to fill the void. The memory also includes decoders 808 to provide access to the appropriate number of word lines.

In accordance with a preferred embodiment of the present invention, the memory includes test and repair logic 810. Techniques for testing for bad rows are known in the art and are not the focus of the present invention. Test and repair logic 810 identifies a bad row or row group and sets the appropriate SHIFT control signals for shift circuits 806.

With reference now to FIG. 9, a flowchart of the operation of a row shifting repair scheme is illustrated in accordance with a preferred operation of the present invention. The process begins and tests the memory (step 902). Next, a determination is made as to whether the memory passes or fails the test (step 904). If the memory passes the test, the process passes the memory (step 906) and ends.

If the memory fails the test in step 904, a determination is made as to whether the memory is repairable (step 908). If the memory is repairable in step 908, the process disables the row group select signal and word line signal for the bad row group (step 912). Thereafter, the process activates the shift circuit for the bad row group and each row group after the bad row group (912). Thereafter, the process returns to step 902 to retest the memory. If the memory is not repairable in step 908, the process fails the memory (step 914) and ends.

Thus, the present invention solves the disadvantages of the prior art by providing a row group repair scheme that includes a shifting stage. A plurality of shift circuits are selectively activated to shift Out a bad row group. A redundant row group is provided to fill the void. The present invention does not require complicated row address remap circuitry. Thus, the row group repair scheme of the present invention has a time and performance penalty than prior art repair schemes.

What is claimed is:

1. A method for repairing a bad row group in a memory, wherein the memory includes a plurality of row groups and a test and repair logic, comprising:
   testing the plurality of row groups using the test and repair logic;
   identifying a first row group from the plurality of row groups as a bad row group using the test and repair logic;
   disabling the bad row group using the test and repair logic;
   selectively activating a first shift circuit to shift the first row group using the test and repair logic; and
   shifting in a redundant row group using the test and repair logic.

2. The method of claim 1, wherein the step of shifting in a redundant row group includes:
   activating the first shift circuit to shift a first row select signal for the first row group to an adjacent row group.

3. The method of claim 1, wherein the step of shifting in a redundant row group includes:
   activating a second shift circuit to shift a second row select signal to a redundant row group.

4. The method of claim 1, wherein the step of shifting in a redundant row group includes:
   selectively activating each shift circuit between the bad row group and the redundant row group.

5. The method of claim 4, wherein the step of selectively activating each shift circuit between the bad row group and the redundant row group includes generating a shift signal for each shift circuit between the bad row group and the redundant row group.

6. The method of claim 1, wherein each row group is one row.

7. A memory, comprising:
   a plurality of row groups;
   a redundant row group;
   a plurality of shift circuits, wherein each shift circuit corresponds to a row group; and
   a test and repair logic that tests the plurality of row groups, identifies a bad row group from the plurality of row groups, disables the bad row group, selectively activates a first shift circuit from the plurality of shift circuits to shift the first row group, and shifts in a redundant row group.

8. The memory of claim 7, wherein the test and repair logic activates the first shift circuit to shift a first row select signal for the first row group to an adjacent row group.

9. The memory of claim 7, wherein the test and repair logic activates a second shift circuit to shift a second row select signal to a redundant row group.

10. The memory of claim 7, wherein the test and repair logic selectively activates each shift circuit between the bad row group and the redundant row group.

11. The memory of claim 7, wherein the test and repair logic generates a shift signal for each shift circuit between the bad row group and the redundant row group.

12. The memory of claim 7, wherein each shift circuit includes a multiplexer.

13. The memory of claim 7, wherein each row group in the plurality of row groups is one row.

* * * * *